(12) United States Patent
Hamm et al.

(10) Patent No.: US 9,366,699 B2
(45) Date of Patent: Jun. 14, 2016

(54) L.E.D. TEST LEAD

(71) Applicants: David James Hamm, Margate, FL (US); Steven Andrew Velez, Margate, FL (US)

(72) Inventors: David James Hamm, Margate, FL (US); Steven Andrew Velez, Margate, FL (US)

( * ) Notice: Subject to any disclaimer, the term of this patent is extended or adjusted under 35 U.S.C. 154(b) by 0 days.

(21) Appl. No.: 14/835,056

(22) Filed: Aug. 25, 2015

(65) Prior Publication Data

US 2015/0362530 A1 Dec. 17, 2015

Related U.S. Application Data

(63) Continuation of application No. 13/199,147, filed on Aug. 22, 2011, now abandoned.

(51) Int. Cl.
| | |
|---|---|
| *G01R 19/145* | (2006.01) |
| *G01R 11/04* | (2006.01) |
| *G01R 1/067* | (2006.01) |
| *F21L 4/02* | (2006.01) |
| *F21V 23/04* | (2006.01) |
| *F21W 131/40* | (2006.01) |
| *F21Y 101/02* | (2006.01) |

(52) U.S. Cl.
CPC . *G01R 11/04* (2013.01); *F21L 4/02* (2013.01); *F21V 23/0414* (2013.01); *G01R 1/06788* (2013.01); *F21W 2131/40* (2013.01); *F21Y 2101/02* (2013.01)

(58) Field of Classification Search
CPC ............... G01R 1/06788; G01R 1/071; G01R 1/06794; G01R 31/026
USPC .......................................... 324/506, 157, 556
See application file for complete search history.

(56) References Cited

U.S. PATENT DOCUMENTS

| | | | | |
|---|---|---|---|---|
| 2003/0098425 A1* | 5/2003 | Sosinsky | ................. | G01N 21/91 250/504 R |
| 2005/0209810 A1* | 9/2005 | Piaud | ..................... | G01D 3/022 702/121 |
| 2011/0063820 A1* | 3/2011 | Wang | ..................... | B25B 23/18 362/120 |

* cited by examiner

*Primary Examiner* — Melissa Koval
*Assistant Examiner* — Courtney McDonnough
(74) *Attorney, Agent, or Firm* — Espinosa Trueba Martinez, PL; Roberto H. Suarez, Esq.

(57) ABSTRACT

A pair of light shining electrical test leads, the pair using L.E.D. or other lights. The lights are showing to the test point of the electrical leads. The lights receive power from a battery. The lights may be turned off when not needed and turned on when the user is in locations of little or no light. When in locations of little or no light, the user shall use the lights to help determine electrical current while seeing better to avoid injuries.

2 Claims, 2 Drawing Sheets

L.E.D. TEST LEAD

CROSS-REFERENCE TO RELATED APPLICATIONS

This non-provisional patent application claims the benefit of the currently pending U.S. Non Provisional patent application Ser. No. 13/199,147, filed on 22 Aug. 2011, which is incorporated by reference as if fully set forth herein.

BACKGROUND

As a tradesman myself, I always have a need for the volt meter. I always run into the problem of needing a flashlight while taking meter reads. It wouldn't be such a problem, but the volt meter needs two hands to use. It is a struggle holding two test leads, one in each hand while holding a flashlight to see what's going on. With my L.E.D. test leads, nobody will struggle with downtime on a job or risk of injury. Electrical test leads are used to carry electrical current or other signals from a test point to a meter. The meter leads are simple to use, however when in dark or dim locations can be very difficult. Nothing has been attempted to solve this sometimes dangerous problem. This invention takes aim directly at this frustrating problem by attaching lights to the electrical leads to aide in safety and ease.

SUMMARY

With this invention, checking for electrical signals is easy and safe in all locations, whether in daylight or places such as attics, basements, dark rooms, at any hour of day or night.

The L.E.D. test leads are a pair of one black lead, usually for negative/ground/neutral, and one red lead, usually for positive or other point of electrical signal. Each lead has L.E.D. lights aimed at the test point. These lights are aimed at the test point allowing the user a comfortable view with one hand on each test lead with no hassle of trying to manage a flashlight at the same time.

The lights can be turned off in locations of sufficient light and back on in locations of little or no light. The lights can be turned on by twisting the tips of the leads to make connection with a battery. This invention eliminates the doubt and fear of working with electrical components in insufficiently lighted areas.

DESCRIPTION

Figure 1:
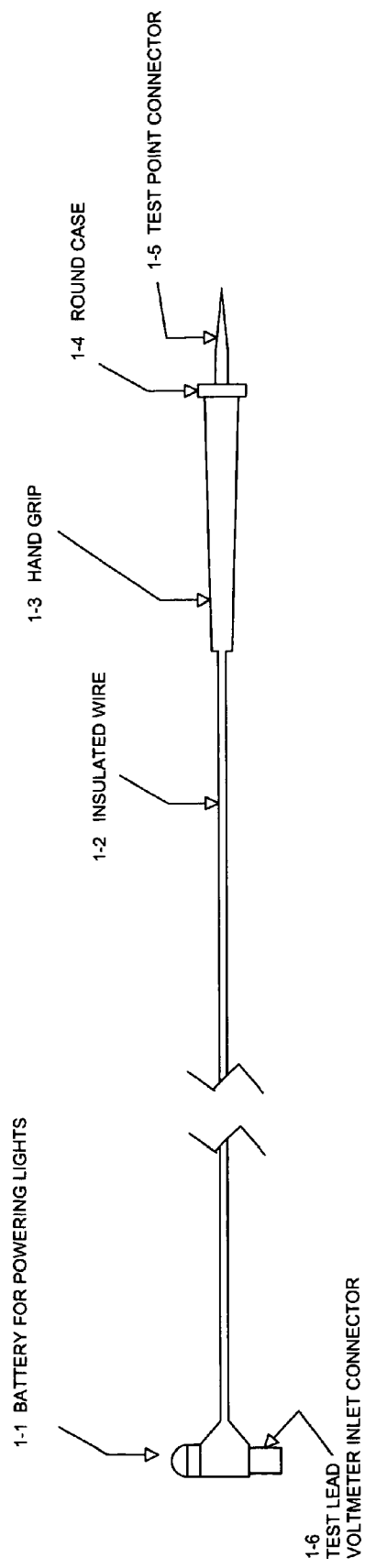
FIG. 1 is a general view of the L.E.D. test leads.

Referring to FIG. 1, 1-1 shows a small battery used to power the L.E.D. lights on the test leads. The battery is located on the back of the test lead voltmeter inlet connector (1-6). The test lead voltmeter inlet connector is where the test leads connect to a volt or ohm meter which reads the electrical signals. The test lead voltmeter inlet connector is compatible with most American and foreign volt/ohm meters. The electrical signals are carried to the voltmeter through a 3' insulated wire (1-2). The wire is insulated for safety. The wire receives signals from the Test point connector (1-5) and carries them to the meter. Electrical signals are taken from an electrical circuit at the test point, carried through the insulated wire to the meter which then reads the signals back to the user. (1-3) shows a hand grip; this is where the user olds the test leads, one in each hand. At the end of the hand grip is a round case (1-4). Mounted to the round case are 3 L.E.D. lights shining towards the test point connector. These leads shall aide the user by negating the need to hold a flashlight while holding the test leads by the hand grip, one in each hand.

Figure 2:
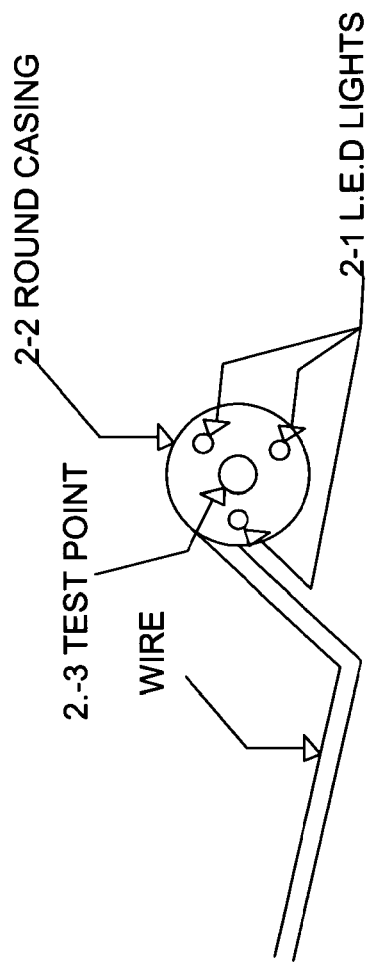
FIG. 2 is a view of test leads that are operable with lights on or off.

The L.E.D. test leads as shown in FIG. 2 are operable with the lights on or off. When checking for electrical signals in dark environments, at test points which are a long distance apart, it can be difficult to direct a flashlight at both test points at the same time while also holding both test leads securely on the test point. The L.E.D. test leads eliminate this problem by simply turning on the L.E.D. lights (FIG. 2-1). The lights are mounted at the bottom of the round casing (FIG. 2-2) and are directed towards the test point (FIG. 2-3) to ensure hands are free to hold test leads safely and securely on electrical circuit test points.

I claim:

1. An apparatus for testing of electrical circuits, the apparatus comprising:
    an electrically conductive test point connector with a first end and a second end;
    an insulated conductive wire with a first end and a second end, wherein said first end is conductively connected to said test point connector second end;
    a non-conductive case surrounding at least a portion of said test point connector at said test point connector second end, and axially aligned with respect to said test point, wherein said case includes at least a first face and a second face, wherein said first face is disposed towards said test point connector, and said second face is disposed away from said test point connector;
    a non-conductive grip axially aligned to, and protruding from, said case second face;
    a plurality of LEDs radially disposed about said test point connector and partially embedded in said case wherein non-embedded light-emitting portion of said LEDs are exposed through said round case first face;
    a battery electrically connected to said LEDs; and
    an on/off switch electrically connected between said battery and said LEDs and embedded in between said non-conductive case and said test point connector, wherein said on/off switch functions by the user rotating said test point connector with reference to said non-conductive case in order to close or open the electrical connection between said LEDs and said battery.

2. An apparatus for testing of electrical circuits, the apparatus comprising:
    an electrically conductive test point connector with a first end and a second end;
    an insulated conductive wire with a first end and a second end, wherein said first end is conductively connected to said test point connector second end;
    a non-conductive case surrounding at least a portion of said test point connector at said test point connector second end, and axially aligned with respect to said test point, wherein said case includes at least a first face and a second face, wherein said first face is disposed towards said test point connector, and said second face is disposed away from said test point connector;
    a non-conductive grip axially aligned to, and protruding from, said case second face;
    a plurality of LEDs radially disposed about said test point connector and partially embedded in said case wherein non-embedded light-emitting portion of said LEDs are exposed through said round case first face;

an inlet connector with a first face and second face, wherein said first face has an electrical junction adapter that is conductively connected to said insulated conductive wire second end;

a battery electrically connected to said LEDs and attached to said inlet connector second face; and an on/off switch electrically connected between said battery and said LEDs and embedded in between said non-conductive case and said test point connector, wherein said on/off switch functions by the user rotating said test point connector with reference to said non-conductive case in order to close or open the electrical connection between said LEDs and said battery.

\* \* \* \* \*